US009837268B2

(12) United States Patent
Qi et al.

(10) Patent No.: US 9,837,268 B2
(45) Date of Patent: *Dec. 5, 2017

(54) RAISED FIN STRUCTURES AND METHODS OF FABRICATION

(71) Applicant: GLOBALFOUNDRIES Inc., Grand Cayman (KY)

(72) Inventors: Yi Qi, Niskayuna, NY (US); Xunyuan Zhang, Albany, NY (US); Catherine B. Labelle, Schenectady, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 7 days.

This patent is subject to a terminal disclaimer.

(21) Appl. No.: 15/154,444

(22) Filed: May 13, 2016

(65) Prior Publication Data
US 2016/0260605 A1    Sep. 8, 2016

Related U.S. Application Data

(63) Continuation of application No. 14/309,956, filed on Jun. 20, 2014, now Pat. No. 9,391,140.

(51) Int. Cl.
*H01L 21/02* (2006.01)
*H01L 29/06* (2006.01)
(Continued)

(52) U.S. Cl.
CPC .. *H01L 21/02532* (2013.01); *H01L 21/02639* (2013.01); *H01L 21/311* (2013.01);
(Continued)

(58) Field of Classification Search
CPC ......... H01L 21/02532; H01L 21/02639; H01L 21/311; H01L 21/31144; H01L 29/0649;
(Continued)

(56) References Cited

U.S. PATENT DOCUMENTS 6,653,166 B2   11/2003   Ledentsov
7,399,684 B2   7/2008    Roycroft et al.
(Continued)

OTHER PUBLICATIONS

Tseng et al., "A Self-Assembled Microbonded Germanium/Silicon Heterojunction Photodiode for 25 Gb/s High-Speed Optical Interconnects", Scientific Reports, 3: 3225/DOI: 10.1038/srep03225, Nov. 15, 2013, 6 pages.

*Primary Examiner* — Sophia Nguyen
(74) *Attorney, Agent, or Firm* — Heslin Rothenberg Farley and Mesiti PC; Nicholas Mesiti

(57) ABSTRACT

A method of fabricating raised fin structures is provided, the fabricating including: providing a substrate and at least one dielectric layer over the substrate; forming a trench in the at least one dielectric layer, the trench having a lower portion, a lateral portion, and an upper portion, the upper portion being at least partially laterally offset from the lower portion and being joined to the lower portion by the lateral portion; and, growing a material in the trench to form the raised fin structure, wherein the trench is formed to ensure that any growth defect in the lower portion of the trench terminates either in the lower portion or the lateral portion of the trench and does not extend into the upper portion of the trench.

19 Claims, 12 Drawing Sheets

(51) Int. Cl.
*H01L 21/311* (2006.01)
*H01L 29/66* (2006.01)
*H01L 29/78* (2006.01)

(52) U.S. Cl.
CPC .... *H01L 21/31144* (2013.01); *H01L 29/0649* (2013.01); *H01L 29/0692* (2013.01); *H01L 29/66795* (2013.01); *H01L 29/785* (2013.01)

(58) Field of Classification Search
CPC ........... H01L 29/0692; H01L 29/66795; H01L 29/785
See application file for complete search history.

(56) References Cited

U.S. PATENT DOCUMENTS

| | | | |
|---|---|---|---|
| 8,154,082 B2* | 4/2012 | Moriyama | B82Y 10/00 257/351 |
| 2007/0267722 A1 | 11/2007 | Lochtefeld et al. | |
| 2008/0073667 A1 | 3/2008 | Lochtefeld | |
| 2008/0093622 A1 | 4/2008 | Li et al. | |
| 2009/0321882 A1 | 12/2009 | Park | |
| 2010/0062551 A1 | 3/2010 | Chen et al. | |
| 2010/0072515 A1 | 3/2010 | Park et al. | |
| 2010/0176375 A1 | 7/2010 | Lochtefeld | |
| 2011/0042718 A1 | 2/2011 | Wang et al. | |
| 2011/0049568 A1 | 3/2011 | Lochtefeld et al. | |
| 2011/0068347 A1 | 3/2011 | Strittmatter | |
| 2014/0077223 A1 | 3/2014 | Choe et al. | |
| 2014/0110787 A1 | 4/2014 | Wen et al. | |
| 2015/0041854 A1 | 2/2015 | Wang et al. | |
| 2015/0048422 A1 | 2/2015 | Bruce et al. | |
| 2015/0311292 A1* | 10/2015 | Srinivasan | H01L 29/0684 257/190 |
| 2015/0333481 A1 | 11/2015 | Van Thourhout et al. | |
| 2017/0092736 A1* | 3/2017 | Balakrishnan | H01L 29/6681 |

* cited by examiner

RAISED FIN STRUCTURES AND METHODS OF FABRICATION

CROSS REFERENCE TO RELATED APPLICATIONS

This application is a continuation application of U.S. patent application Ser. No. 14/309,956, filed Jun. 20, 2014, and entitled "RAISED FIN STRUCTURES AND METHODS OF FABRICATION," the entirety of which is hereby incorporated herein by reference.

FIELD OF THE INVENTION

The present invention generally relates to fabricating circuit structures, and more specifically, to raised fin structures and methods of fabrication thereof.

BACKGROUND

Fin field-effect transistor (FinFET) devices continue to be developed to replace conventional planar metal oxide semiconductor field-effect transistors (MOSFETs) in advanced complementary metal oxide semiconductor (CMOS) technology. As is known, the term "fin" refers to a generally vertically-oriented structure within or upon which are formed, for instance, one or more FinFETs or other fin devices, such as passive devices, including capacitors, diodes, etc. Demands for increased performance and smaller device sizes continue to drive development of new techniques for fin fabrication.

SUMMARY OF THE INVENTION

The shortcomings of the prior art are overcome and additional advantages are provided through the provision, in one aspect, of a method of fabricating a raised fin structure, the fabricating including: providing a substrate with at least one dielectric layer above the substrate; forming a trench in the at least one dielectric layer, the trench having a lower portion, a lateral portion, and an upper portion, the upper portion being at least partially laterally offset from the lower portion and being joined to the lower portion by the lateral portion; and, growing a material in the trench to form the raised fin structure, wherein the trench is formed to ensure that any growth defect in the lower portion of the trench terminates either in the lower portion or the lateral portion of the trench and does not extend into the upper portion of the trench.

Also provided herein, in another aspect, is a structure including a substrate with a raised fin structure disposed above the substrate, the raised fin structure including: a lower fin portion; a lateral fin portion; an upper fin portion, the upper fin portion being connected to the lower fin portion by the lateral fin portion and being laterally offset from the lower fin portion; and, wherein the raised fin structure is configured so that any growth defect in the lower fin portion is terminated in the lower fin portion or the lateral fin portion and does not extend into the upper fin portion.

Additional features and advantages are realized through the techniques of the present invention. Other embodiments and aspects are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Reference is made below to the drawings, which are not drawn to scale for ease of understanding, wherein the same reference numbers used throughout different figures designate the same or similar components.

Figure 1A:
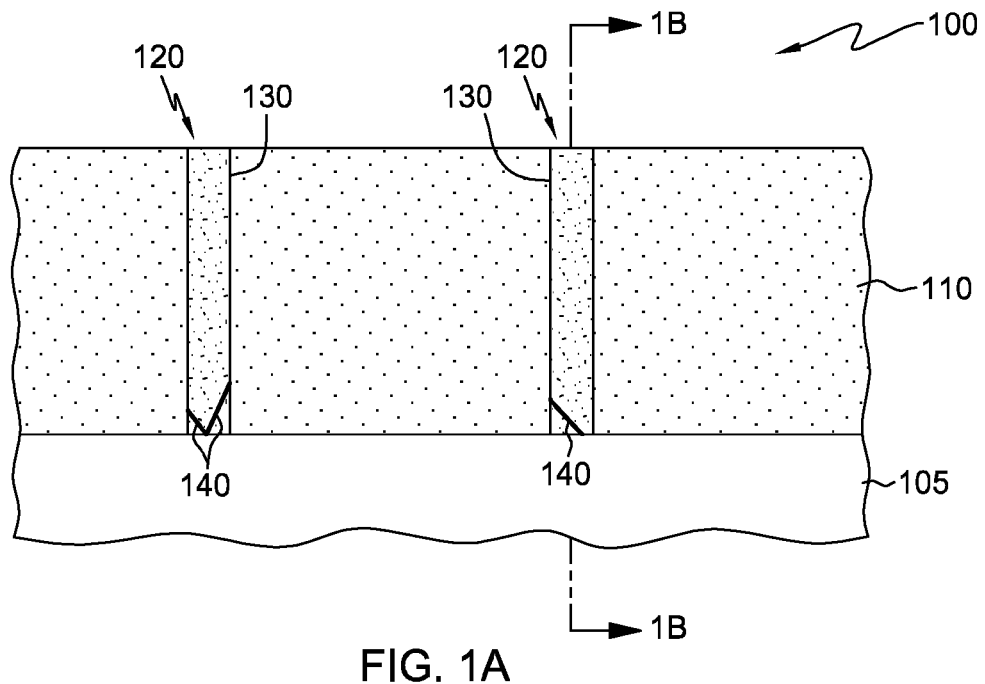
FIGS. 1A-1B depict one embodiment of a raised fin structure that may be grown in a vertical trench, illustrating problems caused by growth defects that may be present throughout the raised fin structure.

FIG. 1A is a transverse cross-sectional view of one embodiment of a portion of a circuit structure 100 including a substrate 105, such as a silicon substrate, a dielectric layer 110, for example a silicon oxide layer, and raised fin structures 120 that have been grown in trenches 130 formed within dielectric layer 110. Raised fin structures 120 may be grown, for example, through epitaxial growth of a material, such as silicon-germanium or a III-IV periodic table material, over substrate 105 within trenches 130 formed in dielectric layer 110. In some circuit structures, raised fin structures 120 may be formed of a material that has a crystalline lattice structure that differs from a crystalline lattice structure of the substrate 105 material, which may result in raised fin structures with characteristics that enhance and improve circuit structure performance. For example, the raised fin structures may be formed of silicon-germanium, which has a larger crystalline lattice spacing than does, for example, silicon. Growing silicon-germanium over a silicon substrate, for example via epitaxial growth, may force the grown silicon-germanium to conform to the smaller lattice structure of the silicon substrate, introducing a desired strain into the silicon-germanium. A silicon-germanium raised fin structure 120 may thus be formed with strain induced in its lattice structure, which may desirably increase electric carrier mobility within raised fin structure 120.

Epitaxial growth processes of one material over a different material may result in crystalline growth defects (or simply "growth defects") 140 within the resulting raised fin structure, such as crystalline threading dislocations, due to the mis-match of crystalline lattice structures between the two materials. Growth defects 140 may generally start at the interface between substrate 105 and the epitaxially grown material, and may continue to propagate along a particular direction up to an interface between raised fin structure 120 and dielectric layer 110, generally at the edge of trench 130. Growth defects 140 may generally terminate at such an interface between the grown material and dielectric layer 110. As illustrated by FIG. 1A, growth defects 140 that grow mainly in a direction transverse to the raised fin structure 120 direction may terminate well below the upper portion of raised fin structure 120, as such growth defects may only propagate a short distance within the grown material before terminating at dielectric layer 110. In many circuit structures, the structure of the upper portion of raised fin structures 120 may be of primary concern, and growth defects 130 terminating in the lower portion of raised fin structures 120 near substrate 105 may have little to no effect on the performance of raised fin structures.

Figure 1B:
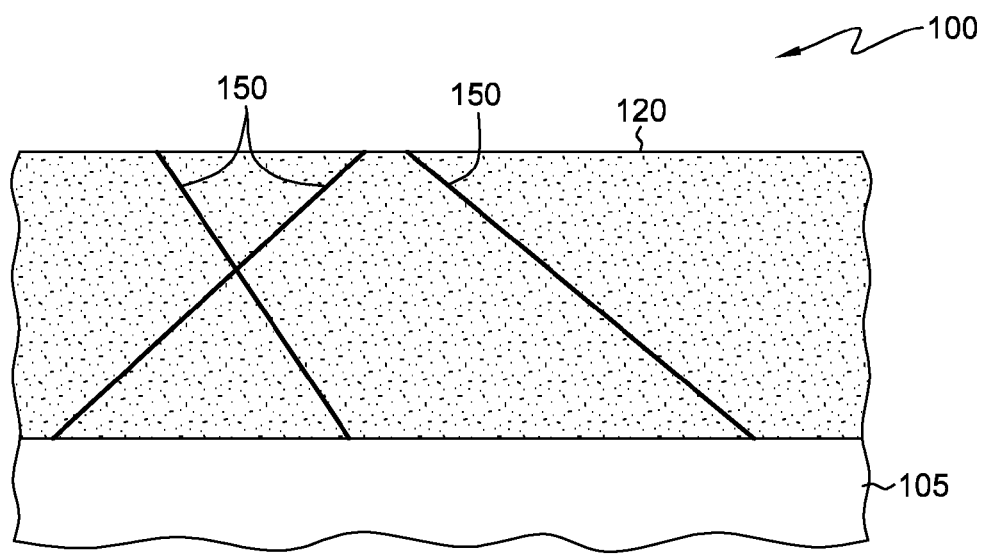

However, as FIG. 1B illustrates, not all growth defects may terminate near substrate 105 as depicted in FIG. 1A. FIG. 1B depicts a cross-section view of one raised fin structure 120 from FIG. 1A, showing a portion of raised fin structure 120 along the direction of the raised fin structure. As FIG. 1B illustrates, growth defects 150 that propagate mainly in the same direction as the direction of the raised fin structure 120 may not terminate near substrate 105, and may continue from the substrate 105 through raised fin structure 120, possibly to the top of raised fin structure 120. Growth defects 150 that form mainly along the direction of the raised fin structure 120 may not encounter a dielectric layer 110 interface which terminates the growth defects 150. Unlike the growth defects 140 depicted in FIG. 1A, which may have little effect on the electrical properties of the upper portion of raised fin structure 120, growth defects 150 in the upper portion of raised fin structure 120 may detrimentally affect carrier flow and other circuit structure properties.

Thus, provided herein, in one aspect, is a method of fabricating a raised fin structure, the fabricating including: providing a substrate with at least one dielectric layer over the substrate; forming a trench in the at least one dielectric layer, the trench having a lower portion, a lateral portion, and an upper portion, the upper portion being at least partially laterally offset from the lower portion and being joined to the lower portion by the lateral portion; and, growing a material in the trench to form the raised fin structure, wherein the trench is formed to ensure that any growth defect in the lower portion of the trench terminates either in the lower portion or the lateral portion of the trench and does not extend into the upper portion of the trench.

Also provided herein, in another aspect, is a structure including a substrate with a raised fin structure disposed above the substrate, the raised fin structure including: a lower fin portion; a lateral fin portion; an upper fin portion, the upper fin portion being connected to the lower fin portion by the lateral fin portion and being laterally offset from the lower fin portion; and, wherein the raised fin structure is configured so that any growth defect in the lower fin portion is terminated in the lower fin portion or the lateral fin portion and does not extend into the upper fin portion.

Figure 2A:
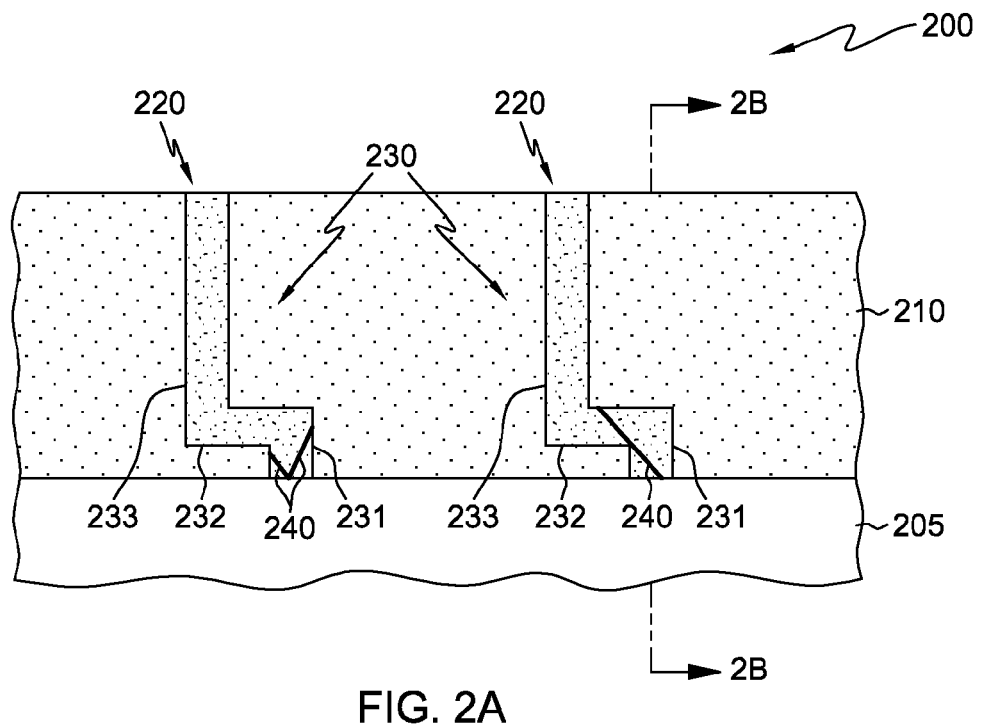
FIGS. 2A-2B depict one embodiment of raised fin structures formed in respective trenches configured to address the problems illustrated by FIGS. 1A-1B, and having defect-free upper fin portions of the raised fin structures, in accordance with one or more aspects of the present invention.
Figure 2B:
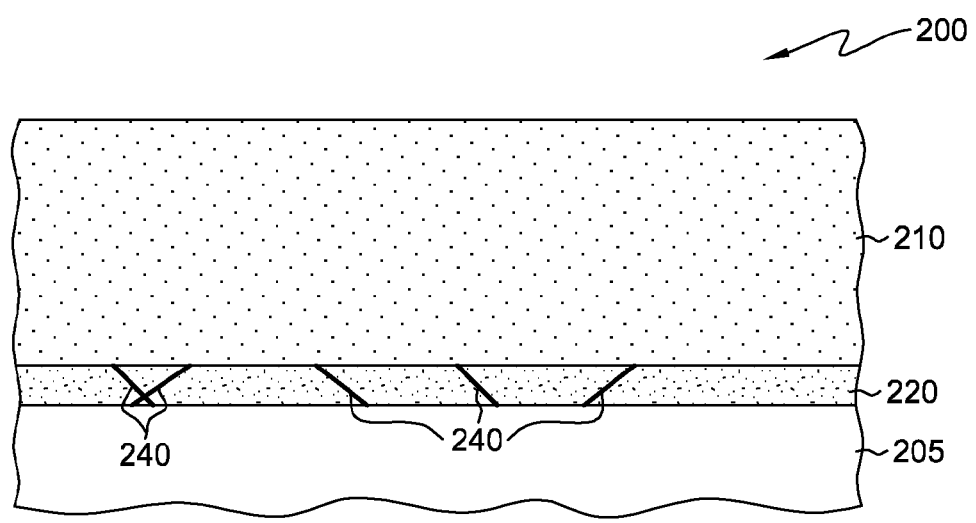

FIGS. 2A-2B illustrate one embodiment of a trench and raised fin structure that may address one or more issues described above. FIG. 2A is a transverse cross-sectional view of one embodiment of a portion of a circuit structure 200 including a substrate 205, such as a silicon substrate, a dielectric layer 210, for example a silicon oxide layer, and raised fin structures 220 that have been grown in trenches 230 formed within dielectric layer 110. Each of trenches 230 has a lower portion 231, a lateral portion 232, and an upper portion 233. Upper portion 233 may be at least partially offset from lower portion 231, and may be joined to lower portion 231 by lateral portion 232. In one example, depicted by the example of FIG. 2A, upper portion 233 and lower portion 231 may have no overlap. In another example, also depicted by the example of FIG. 2A, lower portion 231 adjoins a first end of lateral portion 232 and upper portion 233 adjoins a second end of lateral portion 232. Growth defects 240 may grow in the lower portion 231 of trench 230 during formation of raised fin structure 220, but may terminate either in lower portion 231 or in lateral portion 232, and may not extend into upper portion 233. The resulting raised fin structure 220 may thus have a defect-free upper fin portion, and may have a lower fin portion and a lateral portion in which growth defects are terminated and prevented from extending into the upper fin portion.

FIG. 2B is a cross-sectional view of a portion of circuit structure 200 of FIG. 2A, depicting a portion of the lower fin portion and lateral fin portion of raised fin structure 220 above substrate 205. FIG. 2B also illustrates growth defects 240 in raised fin structure 220 as having been terminated in either the lower fin portion or lateral fin portion of raised fin structure 220 at an interface between dielectric layer 210 and raised fin structure 220. Growth defects may, as illustrated, be defects that have propagated mainly along the direction of raised fin structure 220. Thus, trench 230 of FIG. 2A may be configured to ensure that any growth defect in the lower portion 231 of the trench 230 terminates either in the lower portion 231 or the lateral portion 232 of the trench and does not extend into the upper portion of the trench 233.

Figure 2C:
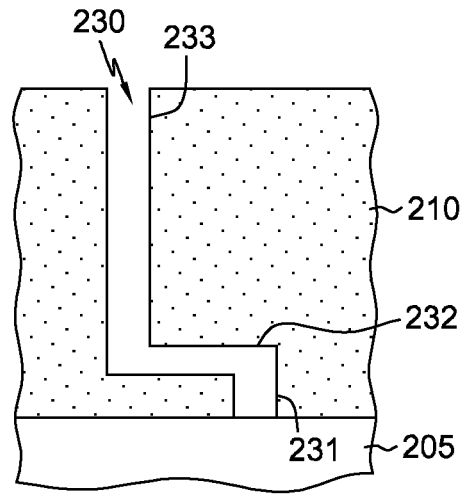
FIGS. 2C-2F depict one embodiment of a growth process in one of the trenches depicted by FIGS. 2A-2B, illustrating how the trench configuration facilitates terminating growth defects and forming raised fin structures with defect-free upper fin portions, in accordance with one or more aspects of the present invention.
Figure 2D:
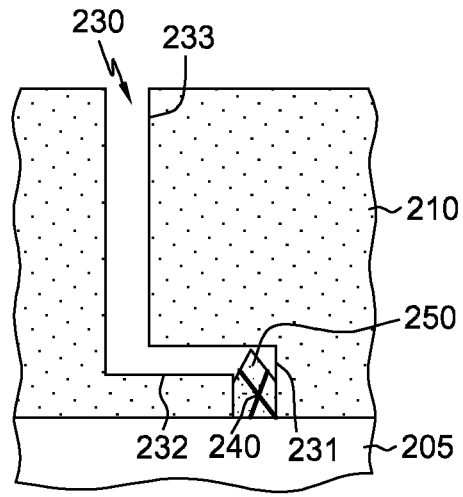

FIGS. 2C-2F further illustrate effects that the configuration of a trench 230, as depicted by FIGS. 2A-2B, may have on the growth of material 250 and growth defects 240 in forming a raised fin structure. FIG. 2C depicts trench 230 having lower portion 231, lateral portion 232, and upper portion 233. In the example depicted, upper portion 233 and lower portion 231 are joined by lateral portion 232 and do not overlap, and lower portion 233 adjoins a first end of lateral portion 232 and upper portion 233 adjoins a second end of portion 232. FIG. 2D depicts trench 230 of FIG. 2C as material 250 is grown in trench 230, for example by epitaxially growing material 250 over substrate 205. As material 250 begins growing over substrate 205, growth defects 240 may form in material 250 beginning at the interface between material 250 and substrate 205. Growth defects may occur due to material 250 having a different crystalline lattice structure from substrate 205. For example, substrate 205 may be a silicon substrate, and material 250 may be a silicon-containing material, such as silicon-germanium, or a III-V periodic table material, such as gallium arsenide, having a different crystalline lattice structure from the silicon substrate 205. Growth defects 240 may continue to propagate in a particular direction as material 250 continues to be epitaxially grown.

Figure 2E:
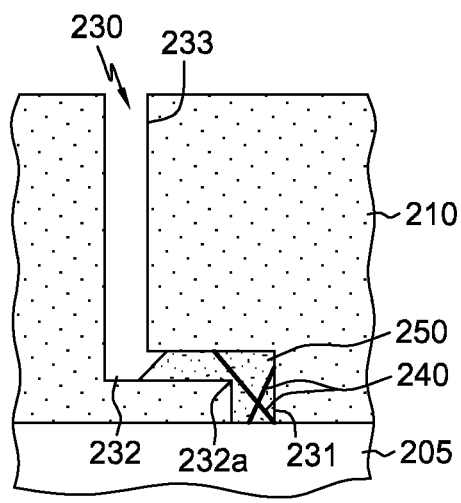

FIG. 2E depicts trench 230 of FIG. 2D as growth of material 250 progresses and grows in lateral portion 232, after having filled lower portion 231. At the junction 232*a* between lower portion 231 and lateral portion 232, the direction of the growth of material 250 changes. Growth defects 240 may continue to propagate into lateral portion 232 as growth of material 250 continues, but the direction of the propagation of growth defects 240 may not change, as growth defects generally propagate in a particular direction without change until terminated. Thus, growth defects 240 that begin growing in lower portion 231 may terminate in lower portion 231 or lateral portion 232. As material 250 grows in lateral portion 232, new growth defects generally may not begin in lateral portion 232 as the material 250 may grow over already-grown material of the same type and lattice structure, and therefore may grow without defect.

Figure 2F:
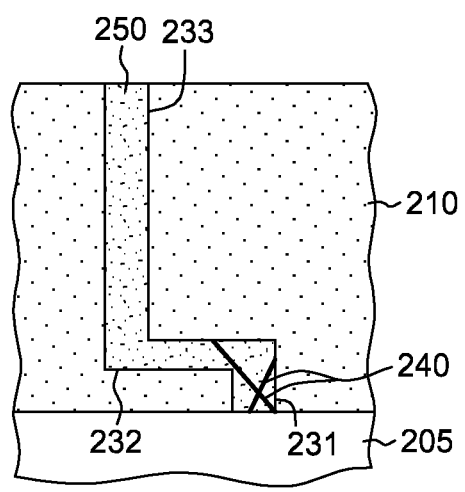

FIG. 2F depicts trench 230 of FIG. 2E following growth of material 250 through lateral portion 232 and upper portion 233 to form raised fin structure 220. Upper portion 233 may be offset from lower portion 231, and the offset may be chosen or configured so that growth defects 240 that extend from lower portion 231 into lateral portion 232 terminate at an edge of lateral portion 232, as depicted in FIG. 2F, without extending into upper portion 233. Thus, the material 250 grown in upper portion 233 may have no defects, resulting in a raised fin structure 220 having a defect-free upper fin portion. In one ideal example, the offset between upper portion 233 and lower portion 231 may result in upper portion 233 and lower portion 231 having no overlap, as illustrated by FIGS. 2A-2F. The lack of overlap between upper portion 233 and lower portion 231 may facilitate preventing growth defects 240 from extending into upper portion 233. Lateral portion 232 may further be configured to ensure that growth defects 240 are unable to extend into upper portion 233. An appropriate configuration of lateral portion 232, including the length and/or height thereof, may depend, in part, on the height and/or width of lower portion 231. For example, for a large width of lower portion 231, the length of lateral portion 232 may also be large to ensure that the offset between upper portion 233 and lower portion 231 is large enough to ensure that growth defects 240 may be forced to terminate in lateral portion 232 without extending into upper portion 233. In another example, for a large height and narrow width of lower portion 231, lateral portion 232 may be made shorter to reduce the offset between upper portion 233 and lower portion 231. A smaller offset between upper portion 233 and lower portion 231 may be desirable, for example, in circuit structures with small pitch or critical dimension design requirements. It may be understood that the configuration of trench 230 may be varied from the examples depicted, and such variations are considered to be within the scope of the disclosure herein.

FIGS. 3A-3J depict one embodiment of a method for fabricating a raised fin structure, as for example depicted in FIGS. 2A-2F, including formation of a trench configured to ensure that any growth defect in a lower portion of the trench terminates either in the lower portion or a lateral portion of the trench and does not extend into an upper portion of the trench.

Figure 3A:
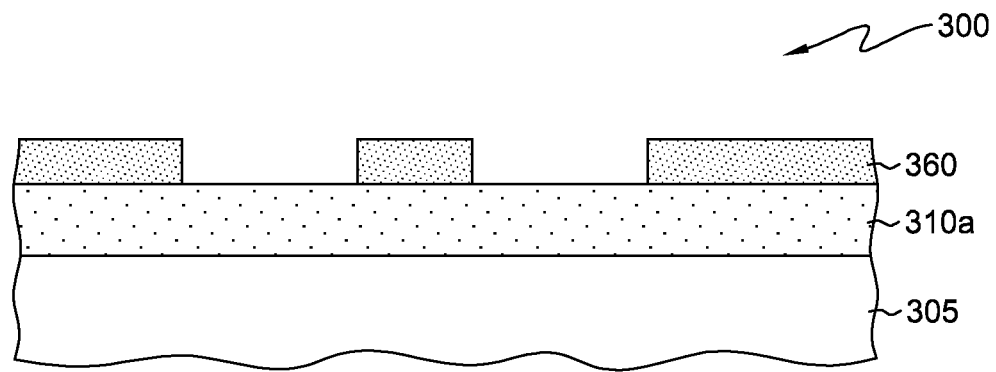
FIGS. 3A-3J depict one embodiment of a process for forming trench structures configured to terminate growth defects therein, in accordance with one or more aspects of the present invention; and, FIGS. 4A-4I depict one embodiment of a process for forming alternative trench structures having multiple upper fin portions, in accordance with one or more aspects of the present invention.
Figure 3B:
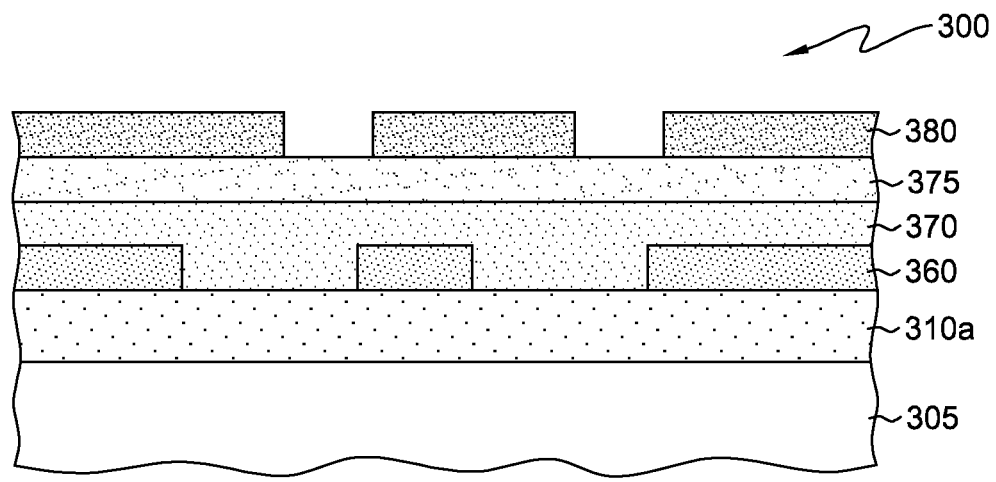

FIG. 3A depicts a portion of an embodiment of a circuit structure 300 including a substrate 305, at least a first dielectric layer 310*a*, and a patterned mask layer 360. First dielectric layer 310*a* may have a thickness T. The thickness T may, in one example, correspond to a desired height of a lower portion of the trench to be formed. The thickness T may, in another example, be greater than a desired height of a lateral portion of the trench to be formed. Patterned mask layer 360 may, in one example, be a patterned hard mask. Patterned mask layer 360 may be patterned, at least in part, to correspond to a lateral portion of a trench to be formed in first dielectric layer 310*a*. FIG. 3B depicts circuit structure 300 of FIG. 3A with a patterned photo-resist layer 380 provided over first dielectric layer 310*a*. In one example, additional layers 370, 375 may also be provided over first dielectric layer 310*a* and below patterned photo-resist 380. Additional layers 370 and 375 may, for example, include an organic planar layer, an anti-reflective coating layer, or other material layers that may be used to facilitate a photolithographic process. Patterned photo-resist 380 may expose a portion of first dielectric layer 310*a* or a portion of one of additional layers 370, 375, the portion corresponding to the lower portion of a trench to be formed in first dielectric layer 310*a*. Patterned photo-resist 380 may be aligned with patterned mask layer 360 so that the lower portion, when formed, may adjoin a first end of the lateral portion to be formed using patterned mask layer 360.

Figure 3C:
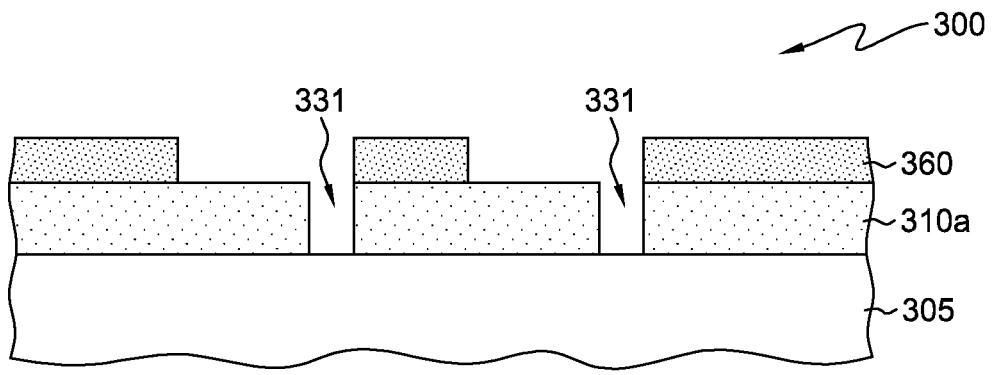

FIG. 3C depicts circuit structure 300 of FIG. 3B following a first etch process. The first etch process may, for example, include a lithographic etch process. The first etch process may etch through first dielectric layer 310*a*, and through additional layers 370, 375 if provided, to expose a portion of substrate 305 and define the lower portion 331 of the trench. In one example, the first etch process may be leave patterned mask layer 360 unetched. Following the first etch, patterned photo-resist 380 and additional layers 370, 375 may be removed.

Figure 3D:
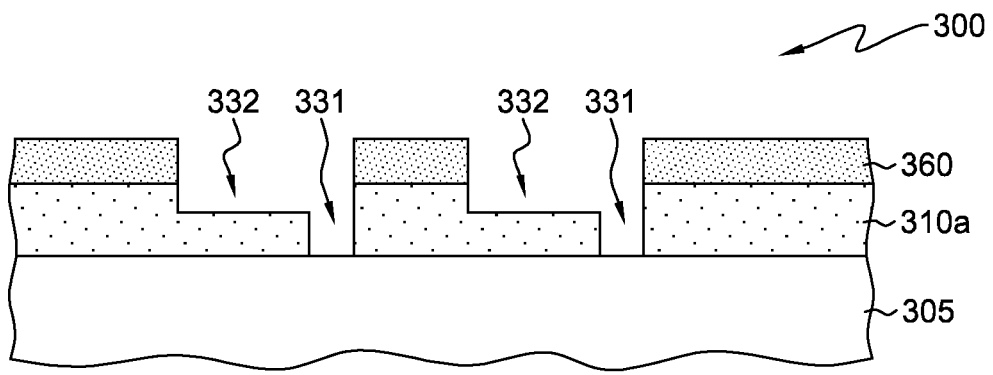

FIG. 3D depicts circuit structure 300 of FIG. 3C following a second etch process. The second etch process may use patterned mask layer 360 to etch a portion of the first dielectric layer 310*a* exposed by patterned mask layer 360 to define lateral portion 232 of the trench in first dielectric layer 310*a*. In one example, as depicted in FIG. 3D, lateral portion 332 may be formed to adjoin lower portion 331 at a first end of lateral portion 332. In one example, the second etch process may be controlled to etch the exposed portion of first dielectric layer 310*a* to a depth D less than the thickness T of first dielectric layer 310*a*, without etching through the entire thickness T of the first dielectric layer 310*a*. The second etch process may, for example, be a directional reactive-ion etch (RIE) process using $NH_3$, $NF_3$ that selectively etches the dielectric material, in which the depth D depends on the total time of the etch process. The second etch process may thus, in part, define a length and height of lateral portion 332.

Figure 3E:
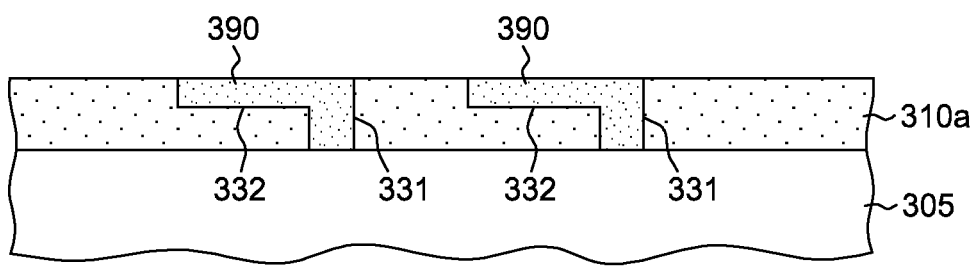

FIG. 3E depicts circuit structure 300 of FIG. 3D following removal of patterned mask layer 360, with lower portion 331 and lateral portion 332 filled with a fill material 390. Patterned mask layer 360 may be removed, for example, by a chemical-mechanical process (CMP) before or after fill material 390 has been added to lateral portion 332 and lower portion 331. Fill material 390 may, for example, be a material such as amorphous silicon, and may be provided to preserve the lateral portion 332 and lower portion 331 through subsequent trench formation steps.

Figure 3F:
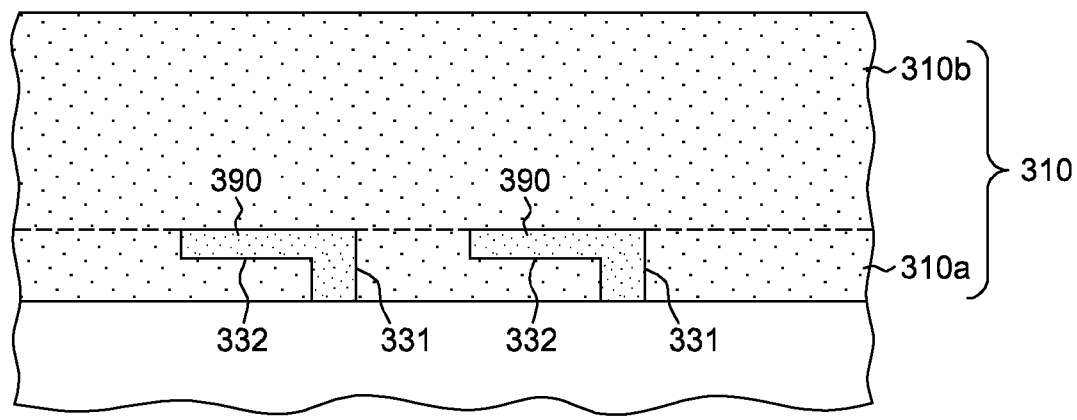

FIG. 3F depicts circuit structure 300 of FIG. 3E following provision of a second dielectric layer 310*b* over first dielectric layer 310*a* and fill material 390. First dielectric layer 310*a* and second dielectric layer 310*b* may together form a single dielectric layer 310 in which the trench is formed. In one example, first dielectric layer 310*a* and second dielectric layer 310*b* may both include an oxide material, such as silicon oxide. Fill material 390 may prevent lateral portion 332 and lower portion 331 from being filled by second dielectric layer 310*b*.

Figure 3G:
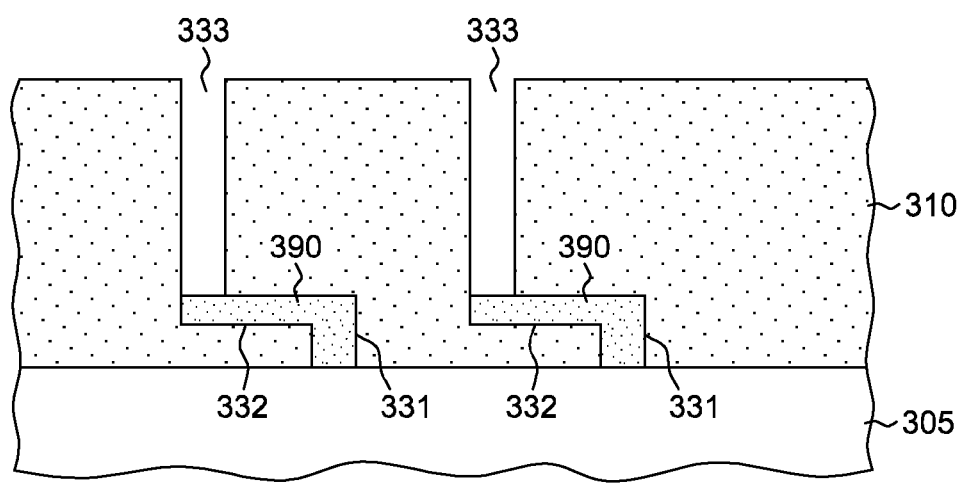
Figure 3H:
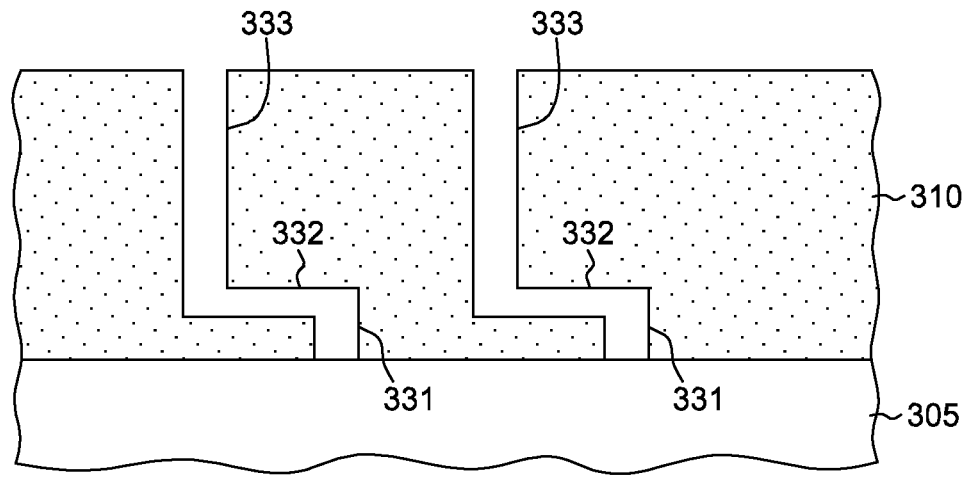

FIG. 3G depicts circuit structure 300 of FIG. 3F following a third etch process that defines upper portion 333 of the trench in dielectric layer 310. The third etch process may, in one example, be configured to stop at fill material 390. The third etch process may be an RIE process using $NH_3$, $NF_3$ that selectively etches the dielectric layer 310 without etching fill material 390. The third etch process may include alignment of an patterned etch mask, such as a patterned photo-resist or patterned hard mask, so that upper portion 333 may be formed to adjoin lateral portion 332 at a second end of lateral portion 332, as depicted in FIG. 3G. FIG. 3H depicts circuit structure 300 of FIG. 3G following removal of fill material 390 from lateral portion 332 and lower portion 331, leaving behind the trenches 330 in dielectric layer 310. Fill material 390 may be removed, in one example, with an HCl etch that affects the fill material, such as amorphous silicon, without etching dielectric material 310.

Figure 3I:
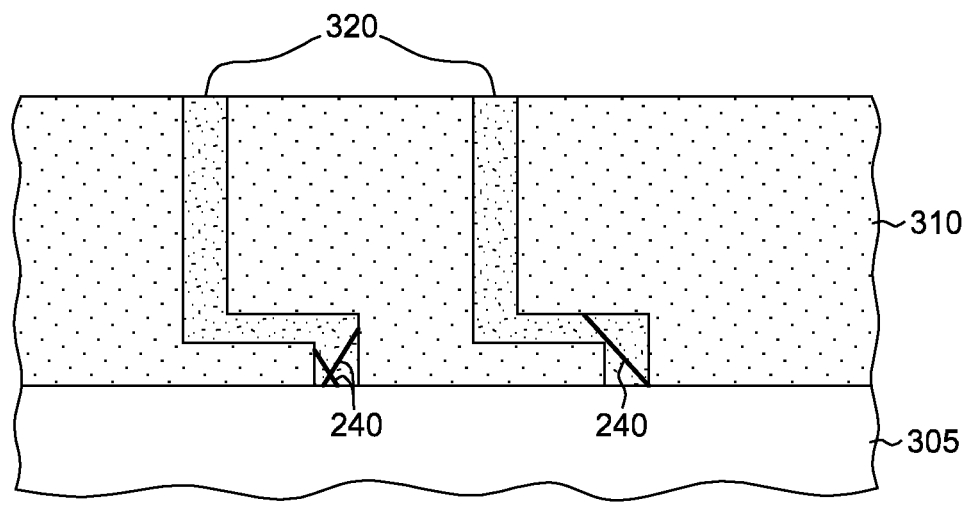

FIG. 3I depicts circuit structure 300 of 3H following growth of a material in trench 330 to form raised fin structure 320, for example as depicted in FIGS. 2C-2F. As previously described, trench 330 may be formed so that growth defects 340 that grow in lower portion 331 terminate in either lower portion 331 or lateral portion 332, and do not extend into upper portion 333. Using trench 330 to fabricate raised fin structure 320 may result in a raised fin structure 320 having a lower fin portion, a lateral fin portion, and an upper fin portion, the raised fin structure 320 configured so that any growth defect 340 may be terminated in the lower fin portion or the lateral fin portion without extending into the upper fin portion.

Figure 3J:
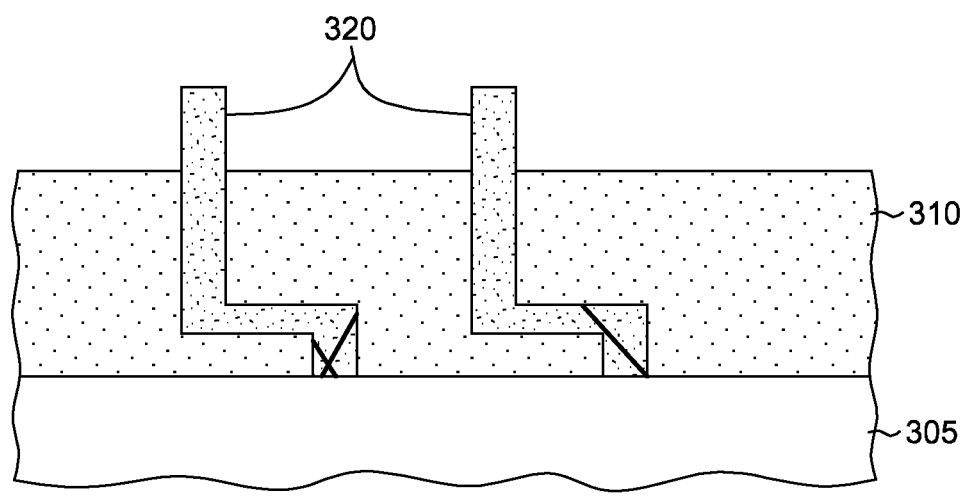

FIG. 3J depicts circuit structure 300 of FIG. 3I following recession, at least in part, of dielectric layer 310. Recessing dielectric layer 310 may expose a portion of the upper fin portion of raised fin structure 320 formed in upper portion 333 of trench 330. The exposed portion of the upper fin portion may, for example, be a defect-free upper fin portion that may be connected to other circuit structure features, such as gate structures or metal contacts.

The process described above may be applied to fabricating raised fin structures for many circuit structures. In particular, the process described above may be applicable to circuit structures for which a pre-defined pitch, or separation between any two raised fin structures, is equal to or greater than the length of the lateral portion 332 of the trench 330 in which a raised fin structure 320 is formed, as illustrated by FIGS. 3G-3J. Design requirements for other circuit structures, however, may have smaller pitch or critical dimension requirements than can be formed by the process as described above. For example, design requirements for a circuit structure may require formation of lower portions 331 of trenches at a pitch smaller than may be resolved by a single lithographic etch process. As another example, design requirements may include a pitch that is smaller than the smallest length that patterned mask layer 360 can adequately resolve formation of lateral portions 332 of trenches. For such circuit structure designs, the process above may be modified to allow the formation of multiple upper portions for a trench, with multiple upper portions of the trench having a lateral spacing at least equal to a pre-defined pitch for the circuit structure.

FIGS. 4A-4I depict one alternative embodiment of a method for fabricating a raised fin structure, including formation of a trench configured to ensure that any growth defect in a lower portion of the trench terminates either in the lower portion or a lateral portion of the trench, in which the formed trench includes a plurality of upper portions, each of the plurality of upper portions of the trench being at least partially laterally offset from the lower portion of the trench, and the plurality of upper portions of the trench being joined to the lower portion of the trench by the lateral portion of the trench.

Figure 4A:
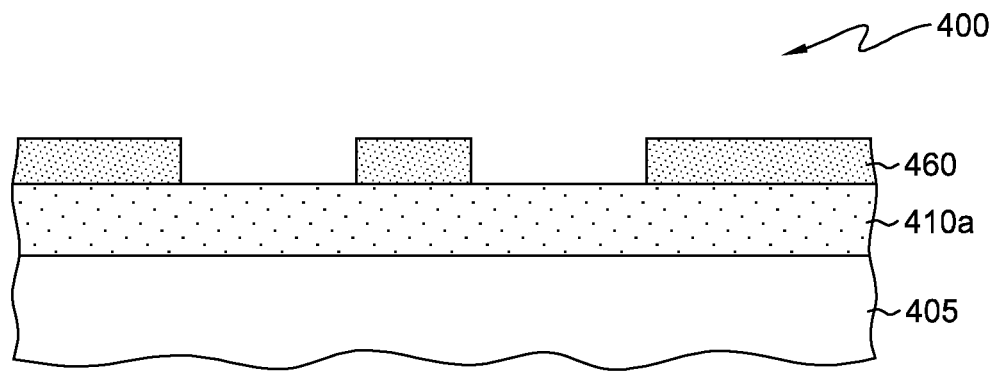

FIG. 4A depicts a portion of an embodiment of a circuit structure 400 including a substrate 405, at least a first dielectric layer 410*a*, and a patterned mask layer 460. First dielectric layer 410*a* may have a thickness T. The thickness T may, in one example, correspond to a desired height of a lower portion of the trench to be formed. The thickness T may, in another example, be greater than a desired height of a lateral portion of the trench to be formed. Patterned mask layer 460 may, in one example, be a patterned hard mask. Patterned mask layer 460 may be patterned, at least in part, to correspond to a lateral portion of a trench to be formed in first dielectric layer 410*a*.

Figure 4B:
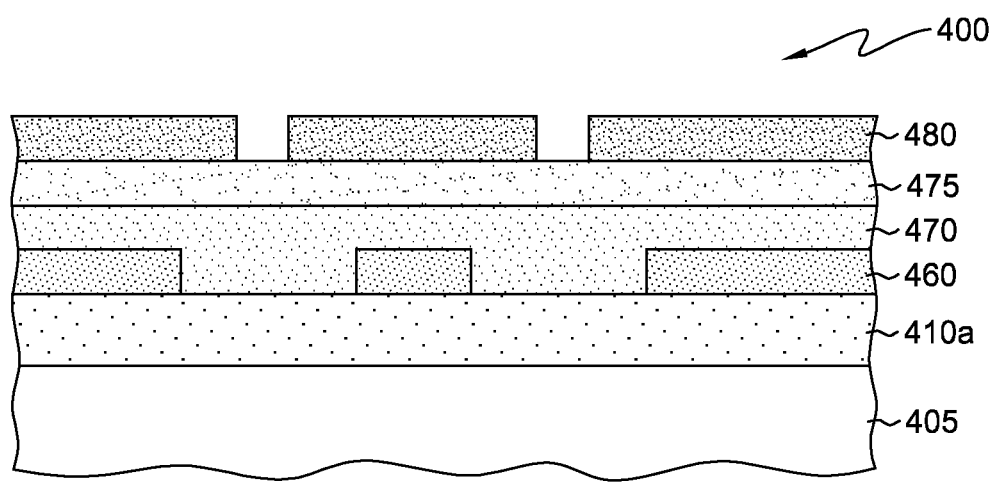

FIG. 4B depicts circuit structure 400 of FIG. 4A with a patterned photo-resist layer 480 provided over first dielectric layer 410*a*. In one example, additional layers 470, 475 may also be provided over first dielectric layer 410*a* and below patterned photo-resist 480. Additional layers 470 and 475 may, for example, include an organic planar layer, an anti-reflective coating layer, or other layers that may be used to facilitate a photo-lithographic process. Patterned photo-resist 480 may expose a portion of first dielectric layer 410*a*, or a portion of one of additional layers 470, 475 if provided, corresponding to the lower portion of a trench to be formed in first dielectric layer 410*a*. Patterned photo-resist 480, in another example, may be aligned with patterned mask layer 460 so that the lower portion may adjoin the lateral portion intermediate a first end and a second end of the lateral portion when formed. In another example, patterned photo-resist 480 may expose a plurality of portions of first dielectric layer 410*a* or a plurality of portions of one of additional layers 470, 475 for the formation of a plurality of lower portions of a plurality of trenches, as depicted by FIG. 4B. The plurality of lower portions 431 may be separated by a span greater than a pre-defined pitch for the circuit structure. For example, the plurality of lower portions 431 may be separated by about twice the pre-defined pitch for the circuit structure; the resulting plurality of upper portions of the plurality of trenches, formed as described below, may then be separated by the pre-defined pitch, as desired for the circuit structure.

Figure 4C:
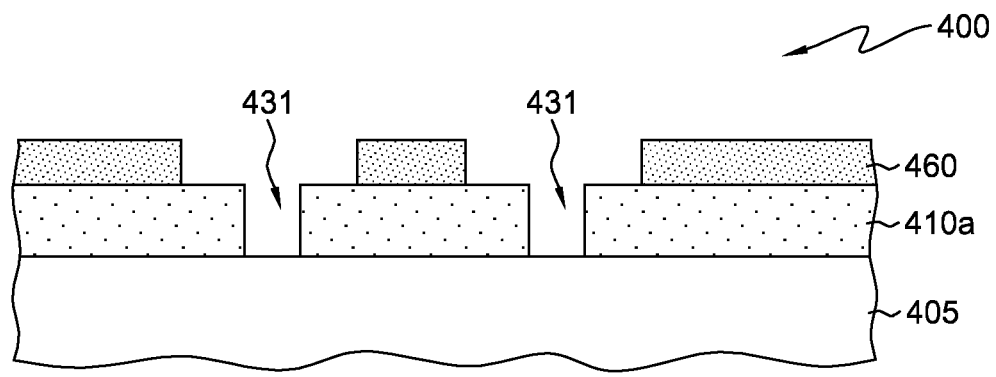

FIG. 4C depicts circuit structure 400 of FIG. 3B following a first etch process that forms the lower portion 431 of the trench. The first etch process may, for example, include a lithographic etch process. The first etch process may etch through first dielectric layer 410*a*, and through additional layers 470, 475 if provided, to expose a portion of substrate 405 and define the lower portion 431 of the trench. In one example, the first etch process may be configured to leave patterned mask layer 460 unetched. Following the first etch, patterned photo-resist 480 and additional layers 470, 475 may be removed.

Figure 4D:
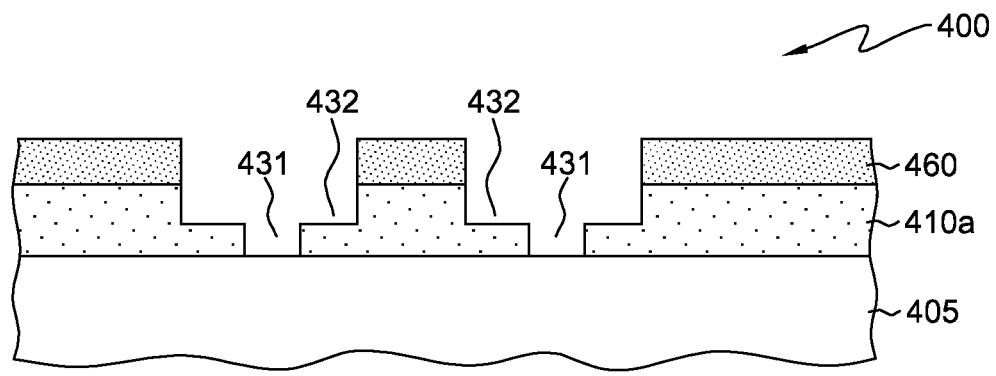

FIG. 4D depicts circuit structure 400 of FIG. 3C following a second etch process that forms lateral portion 432 adjoining lower portion 431. The second etch process may use patterned mask layer 460 to etch a portion of the first dielectric layer 410*a* exposed by patterned mask layer 460. In one example, as depicted in FIG. 4D, lateral portion 432 may be formed to have a first end and a second end, and may be formed so that lower portion 431 adjoins lateral portion 432 intermediate the first end and second end thereof. The second etch process may be controlled to etch the exposed portion of first dielectric layer 410a to a depth D less than the thickness T of first dielectric layer 410a, without etching through the entire thickness T of the first dielectric layer 410a. The second etch process may, for example, be a directional reactive-ion etch (RIE) process using $NH_3$, $NF_3$ that selectively etches the dielectric material, in which the depth D depends on the total time of the etch process. The second etch process may thus, in part, define a length and height of lateral portion 432.

Figure 4E:
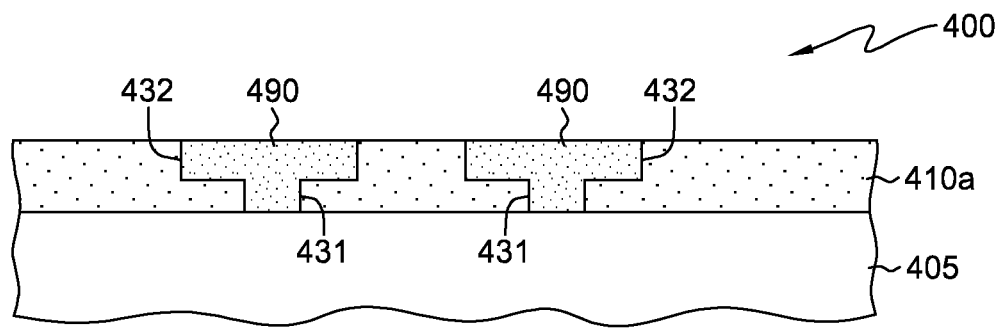

FIG. 4E depicts circuit structure 400 of FIG. 3D following removal of patterned mask layer 460, with lower portion 431 and lateral portion 432 filled with a fill material 490. Patterned mask layer 460 may be removed, for example, by a chemical-mechanical process (CMP) before or after fill material 490 has been added to lateral portion 432 and lower portion 431. Fill material 490 may, for example, be a material such as amorphous silicon, and may be provided to preserve the lateral portion 432 and lower portion 431 through subsequent trench formation steps.

Figure 4F:
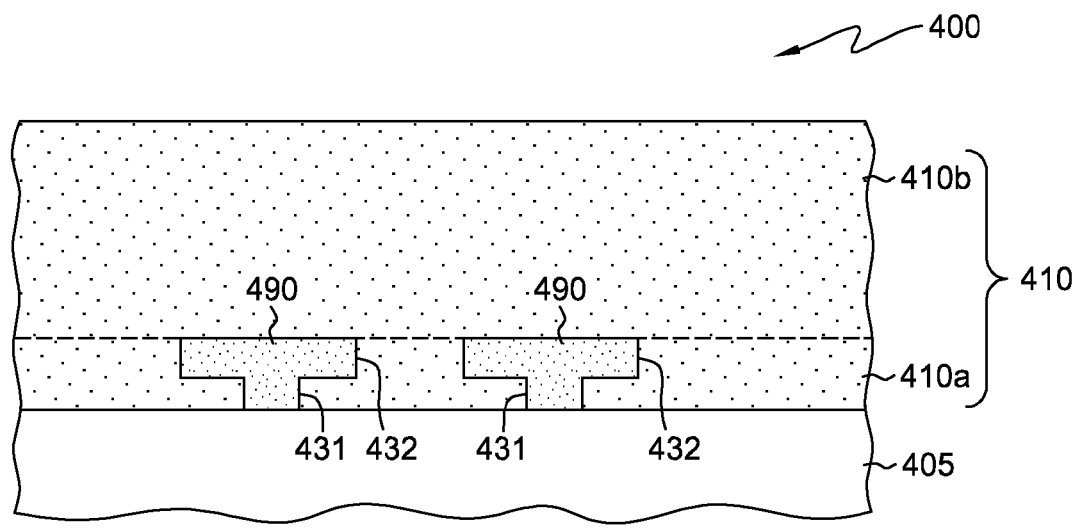

FIG. 4F depicts circuit structure 400 of FIG. 4E following provision of a second dielectric layer 410b over first dielectric layer 410a and fill material 490. First dielectric layer 410a and second dielectric layer 410b may together form a single dielectric layer 410 in which the trench is formed. In one example, first dielectric layer 410a and second dielectric layer 410b may both include an oxide material, such as silicon oxide. Fill material 490 may prevent lateral portion 432 and lower portion 431 from being filled by second dielectric layer 410b.

Figure 4G:
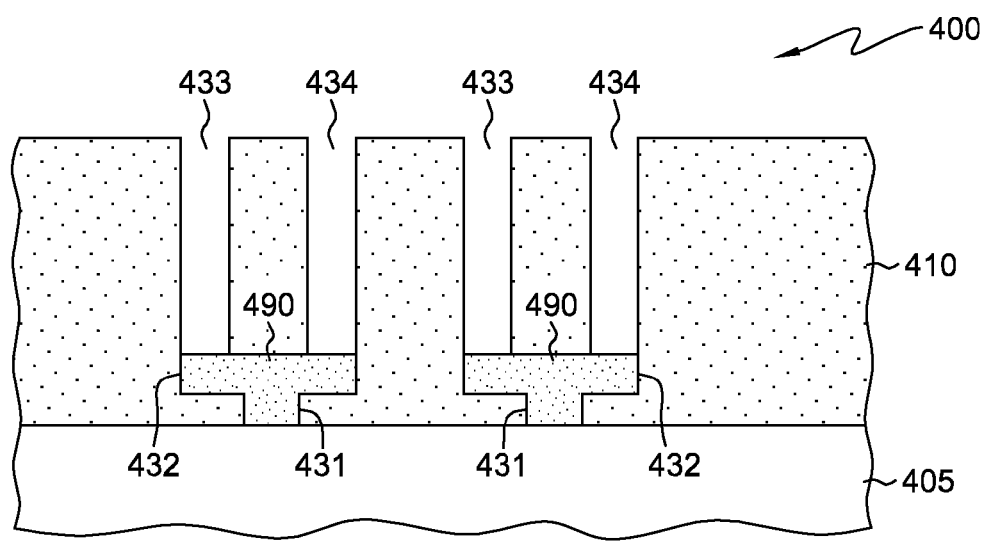

FIG. 4G depicts circuit structure 400 of FIG. 4F following a third etch process that forms a plurality of upper portions 433, 434 of the trench in dielectric layer 410. The plurality of upper portions 433, 434 may be joined to the lower portion 431 by lateral portion 432. The third etch process may, in one example, be configured to stop at fill material 490. The third etch process may be an RIE process using $NH_3$, $NF_3$ that selectively etches the dielectric layer 310 without etching fill material 390. The third etch process may include alignment of a patterned etch mask, such as a patterned photo-resist or patterned hard mask, so that a first upper portion 433 of the plurality of upper portions adjoins lateral portion 432 at a first end thereof, and so that a second upper portion 434 of the plurality of upper portions adjoins lateral portion 432 at a second end thereof. The third etch process may, for example, include a multiple-patterning process, such as a double-patterning process.

Figure 4H:
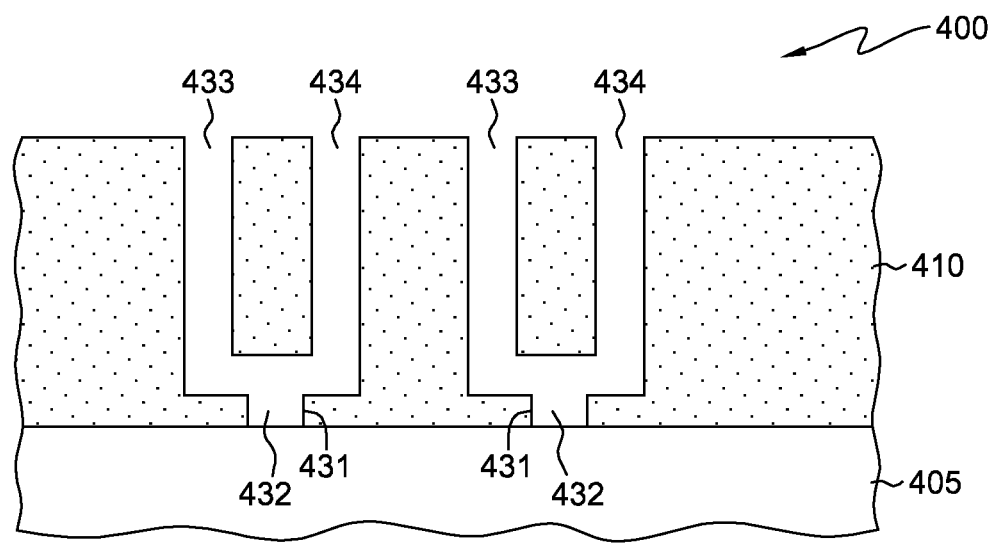
Figure 4I:
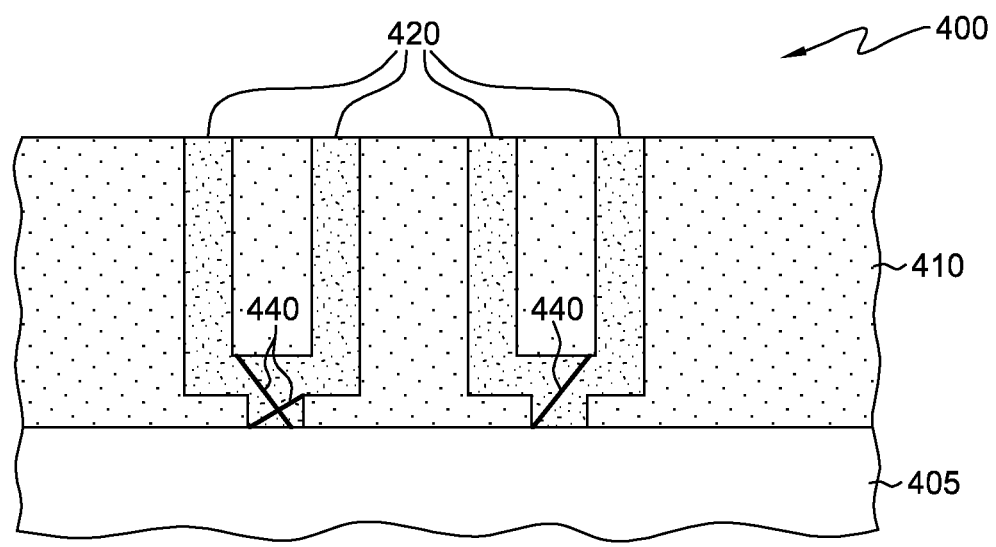

FIG. 4H depicts circuit structure 400 of FIG. 4G following removal of fill material 490 from lateral portion 432 and lower portion 431, leaving behind the trenches 430 depicted. Fill material 390 may be removed, in one example, with an HCl etch that affects the fill material, such as amorphous silicon, without etching dielectric material 310. FIG. 4I depicts circuit structure 400 of 4H following growth of a material in trench 430 to form raised fin structure 420, for example as depicted in FIGS. 2C-2F. As previously described, trench 430 may be configured so that growth defects 440 that grow in lower portion 431 terminate in either lower portion 431 or lateral portion 432, and do not extend into the plurality of upper portions 433, 434. Dielectric layer 410 may, as in FIG. 3J, be subsequently recessed, at least in part, to expose a portion of the plurality of upper fin portions formed in the plurality of upper trench portions 433, 434. The resulting exposed upper fin portions may be separated by the pre-defined pitch for the circuit structure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur this distinction is captured by the terms "may" and "may be."

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

What is claimed is:
1. A method comprising:
fabricating a raised fin structure, the fabricating comprising:
providing a substrate with at least one dielectric layer above the substrate;
forming a trench in the at least one dielectric layer, the trench comprising a lower portion, a lateral portion, and an upper portion, the upper portion being at least partially laterally offset from the lower portion and being joined to the lower portion by the lateral portion;
growing a material in the trench to form the raised fin structure therein, wherein the trench is formed to ensure that any growth defect in the lower portion of the trench terminates either in the lower portion or the lateral portion of the trench and does not extend into the upper portion of the trench; and wherein the at least one dielectric layer comprises a first dielectric layer, and the forming further comprises:
- a first etching to form the lower portion of the trench in the first dielectric layer and expose a portion of the substrate;
- a second etching to form the lateral portion of the trench in the first dielectric layer;
- filling the lower portion and the lateral portion with a fill material;
- and wherein the providing further comprises providing a second dielectric layer over the first dielectric layer and the fill material, and the forming further comprises:
- a third etching to form the upper portion of the trench in the second dielectric layer; and,
- removing the fill material.

2. The method of claim 1, wherein the lower portion and the upper portion have no overlap.

3. The method of claim 1, wherein the lower portion adjoins a first end of the lateral portion and the upper portion adjoins a second end of the lateral portion.

4. The method of claim 1, wherein the growing comprises epitaxially growing the material in the trench from or over the substrate.

5. The method of claim 1, wherein the material grown in the trench comprises one or more of silicon, silicon-germanium, or a III-V periodic table material.

6. The method of claim 1, further comprising recessing the at least one dielectric layer to expose at least a portion of the raised fin structure formed in the upper portion of the trench.

7. The method of claim 1, wherein the upper portion of the trench is one upper portion of a plurality of upper portions of the trench, and wherein the plurality of upper portions of the trench are at least partially laterally offset from the lower portion of the trench, and the plurality of upper portions of the trench are joined to the lower portion of the trench by the lateral portion of the trench.

8. The method of claim 7, wherein the lower portion of the trench has no overlap with any upper portion of the plurality of upper portions of the trench.

9. The method of claim 7, wherein a lateral spacing between a first upper portion and a second upper portion of the plurality of upper portions is at least equal to a pre-defined fin pitch.

10. The method of claim 7, wherein a first upper portion of the plurality of upper portions adjoins a first end of the lateral portion, a second upper portion of the plurality of upper portions adjoins a second end of the lateral portion, and the lower portion adjoins the lateral portion intermediate the first and second ends thereof.

11. The method of claim 1, wherein the fill material comprises one or more of amorphous silicon or an organic material.

12. The method of claim 1, wherein the first etching comprises providing a patterned photo-resist over the first dielectric layer and using the patterned photo-resist to etch through the first dielectric layer to define the lower portion of the trench, and to expose the portion of the substrate.

13. The method of claim 1, wherein the first dielectric layer has a thickness T, and wherein the second etching comprises providing a patterned hard mask over the first dielectric layer, the patterned hard mask exposing at least a portion of the first dielectric layer and the lower portion of the trench, and using the patterned hard mask to etch the exposed portion of the first dielectric layer to a depth D, wherein depth D is less than the thickness T of the first dielectric layer.

14. A method comprising:
fabricating a substrate with a raised fin structure disposed above the substrate, the raised fin structure comprising:
- a lower fin portion extending in a vertical direction;
- a lateral fin portion with a length extending in a lateral direction;
- an upper fin portion extending in a vertical direction from the lateral fin portion, the upper fin portion having a width less than the length of the lateral fin portion being connected to the lower fin portion by the lateral fin portion and being laterally offset from the lower fin portion; and,
- wherein the raised fin structure is configured so that any growth defect in the lower fin portions is terminated in the lower fin portion or the lateral fin portion and does not extend into the upper fin portion.

15. The method of claim 14, wherein the lower fin portion of the raised fin structure and the upper fin portion of the raised fin structure have no overlap.

16. The method of claim 14, wherein the upper fin portion of the raised fin structure is a first upper fin portion of a plurality of upper fin portions of the raised fin structure, the plurality of upper fin portions being at least partially laterally offset from the lower fin portion, and wherein the plurality of upper fin portions of the raised fin structure are joined to the lower fin portion of the raised fin structure by the lateral fin portion of the raised fin structure.

17. The method of claim 16, wherein a lateral spacing between the first upper fin portion and a second upper fin portion of the plurality of upper fin portions of the raised fin structure is at least equal to a pre-defined fin pitch.

18. The method of claim 16, wherein the first upper fin portion of the plurality of upper fin portions adjoins a first end of the lateral fin portion, a second upper fin portion of the plurality of upper portions adjoins a second end of the lateral fin portion, and the lower fin portion adjoins the lateral fin portion intermediate the first and second ends thereof.

19. The method of claim 16, wherein the lower fin portion of the raised fin structure has no overlap with any upper fin portion of the plurality of upper fin portions of the raised fin structure.

* * * * *